United States Patent [19]

Mori

[11] Patent Number: 5,042,123
[45] Date of Patent: Aug. 27, 1991

[54] COMPUTER CONTROLLED AUTOMATED SEMICONDUCTOR PRODUCTION APPARATUS

[75] Inventor: Ryuichiro Mori, Itami, Japan

[73] Assignee: Mitsubishi Denki Kabushiki Kaisha, Japan

[21] Appl. No.: 302,316

[22] Filed: Jan. 26, 1989

[30] Foreign Application Priority Data

Jul. 26, 1988 [JP] Japan .................. 63-184642

[51] Int. Cl.$^5$ .................. H01L 21/56; H01L 21/58; H01L 21/60
[52] U.S. Cl. .................. 29/25.01; 228/5.1; 73/863.02; 198/341
[58] Field of Search .................. 228/4.5, 5.1, 6.1, 103, 228/102, 104, 179, 904, 7, 8, 9, 10, 41, 49.1, 49.4; 29/740, 741, 742, 729, 759, 760, 771, 791, 25.01; 73/863.91, 863.92, 863.01, 863.02; 198/341, 339.1, 347.1, 418.1; 414/786, 498, 627, 752

[56] References Cited

U.S. PATENT DOCUMENTS

| | | |
|---|---|---|
| 4,039,114 | 8/1977 | Yoshida et al. .................. 228/6.2 |
| 4,301,958 | 11/1981 | Hatakenaka et al. .................. 198/341 |
| 4,561,060 | 12/1985 | Hemond .................. 198/341 |
| 4,611,397 | 9/1986 | Janisiewicz et al. .................. 29/740 |
| 4,627,787 | 12/1986 | Bond et al. .................. 414/786 |
| 4,630,811 | 12/1986 | Rudisill .................. 269/118 |
| 4,657,463 | 4/1987 | Pipes .................. 414/498 |
| 4,683,644 | 8/1987 | Tange et al. .................. 29/740 |
| 4,698,766 | 10/1987 | Entwistle et al. .................. 364/474.11 |
| 4,930,086 | 5/1990 | Fukasawa .................. 364/468 |

OTHER PUBLICATIONS

"Disco Shinkawa Assembly Automation", Shinkawa Ltd.

*Primary Examiner*—Olik Chadhuri
*Assistant Examiner*—David E. Graybill
*Attorney, Agent, or Firm*—Leydig, Voit & Mayer

[57] ABSTRACT

An apparatus for producing semiconductor devices includes: a wafer splitting device for splitting a semiconductor wafer into individual dice; an automatic warehouse for lead frames for storing a plurality of kinds of lead frame; an assembly device for assembling a die and a lead frame into a semiconductor device; an automatic die/lead frame transport device for transporting the dice split by the splitting device and lead frames stored in the automatic warehouse to the assembly device; and a computer for controlling the automatic die/lead frame transport device to transport the lead frames of the type and quantity corresponding to the dice split by the splitting device, from the automatic warehouse to the assembly devices. The computer compares the number of non-defective dice with a predetermined production quantity and ensures that a sufficient quantity of non-defective dice to satisfy the production quantity are split and transported to the assembly device. This apparatus is suitable for producing a large variety of semiconductor devices in small lots on an automated continuous basis.

8 Claims, 3 Drawing Sheets

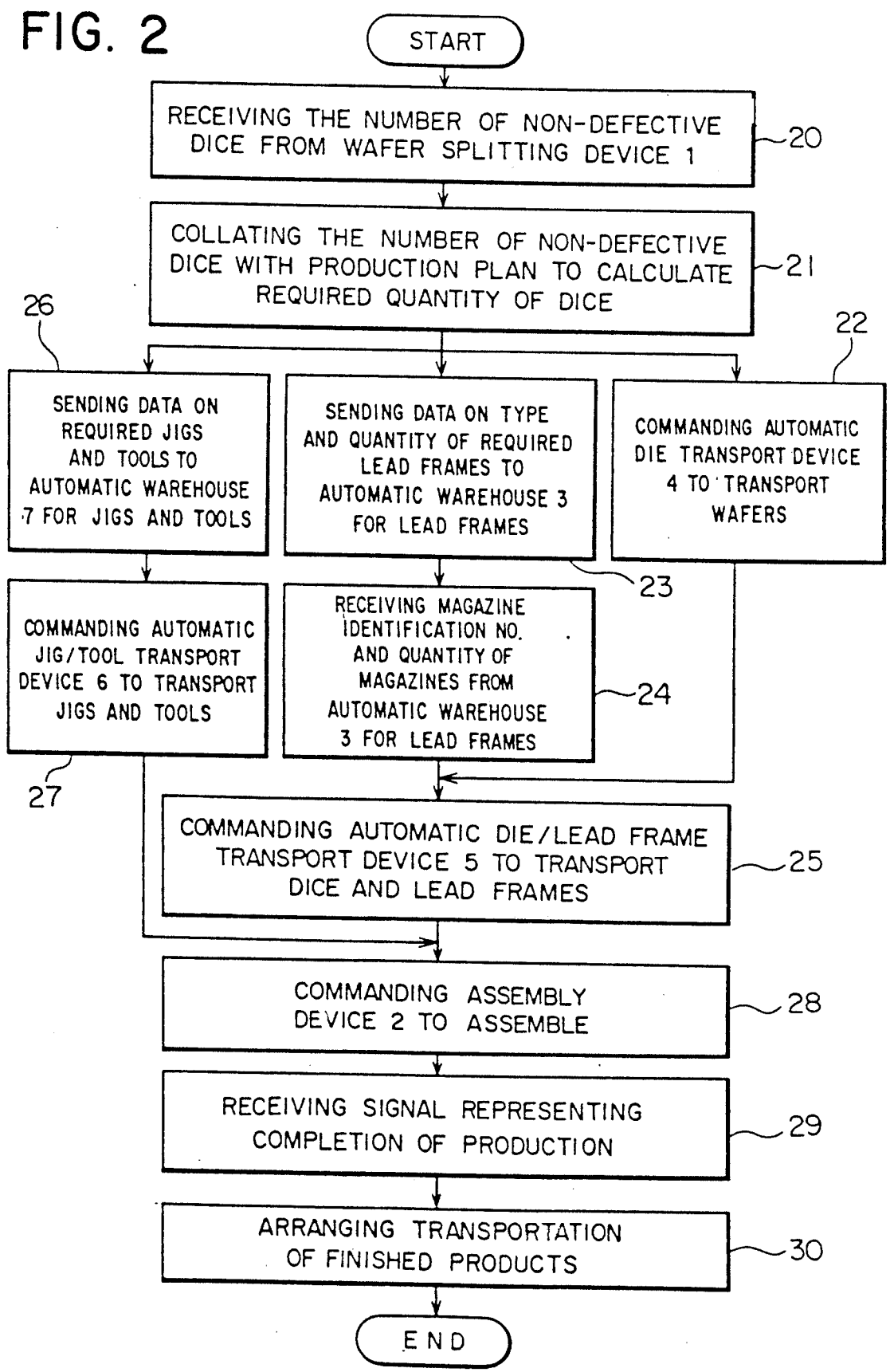

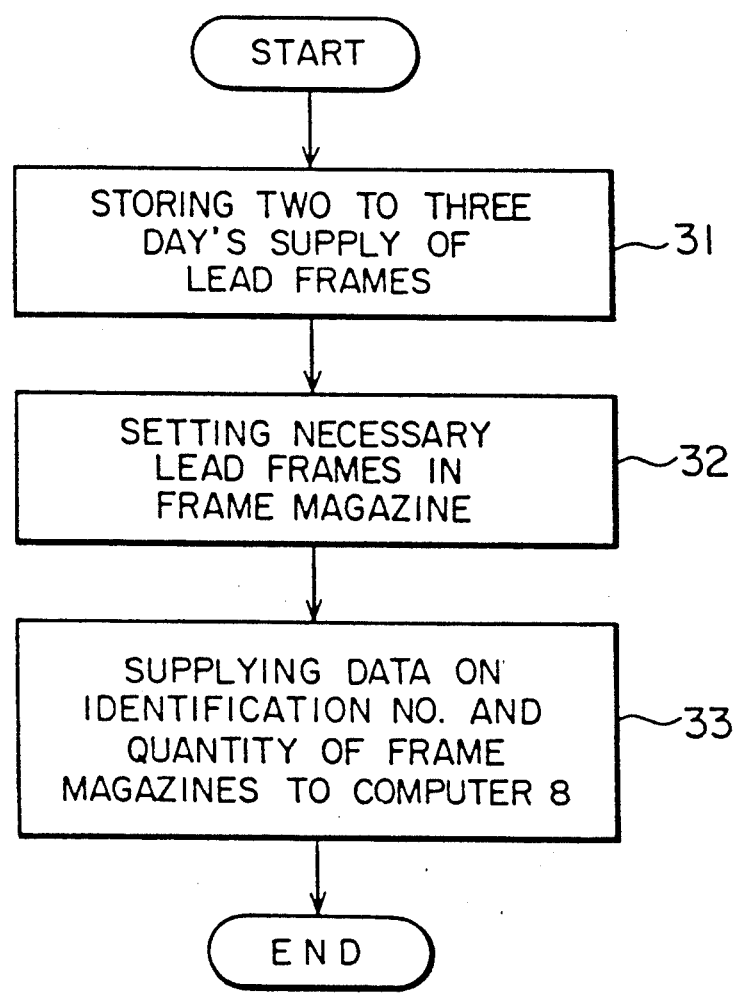

COMPUTER CONTROLLED AUTOMATED SEMICONDUCTOR PRODUCTION APPARATUS

BACKGROUND OF THE INVENTION

1. Field of the Invention

The present invention relates to an apparatus for producing semiconductor devices and, more particularly, to an apparatus suitable for producing a large variety of semiconductor devices in small lots.

2. Description of the Related Art

In producing plastic packaged semiconductor devices, the following processes are required: a splitting process in which a semiconductor wafer is split into individual devices (hereafter referred to as dice); a die bonding process in which a die is bonded to a lead frame in which a plurality of leads have been formed; a wire bonding process in which the leads of the lead frame are bonded to electrodes of the die; and a molding process in which a part of the lead frame and the die are molded with resin. Automation is under way with respect to these processes, and automatic apparatus is already in use. Recent years have seen the development of assembling apparatus capable of performing the various processes from the die bonding process to the molding process. Unmanned operations are thus being adopted more and more widely in manufacturing processes.

At the time of changing a setup when the type of semiconductor device to be produced is changed, dice and lead frames may also need to be replaced, and it is also necessary to replace the jigs and tools used in various processes in correspondence with the relevant dice and lead frames. For this reason, in the automatic machines that are used in various processes, it has become important to allow for the replacement of jigs and tools in a single step.

However, the preparation of the necessary number of lead frames of required types and the preparation of jigs and tools according to the type and quantity of dice during a change in setup has always had to be carried out manually. For this reason, there has been a problem in that complete automation of semiconductor production has been prevented.

In addition, since preparatory work has to be done by man, there are cases where an unnecessarily long time is spent in searching for appropriate lead frames, jigs and tools during a change in setup. Time is required to re-supply lead frames when they are in short supply in the midst of a production run, and errors may be committed in the selection of lead frames, jigs and tools. There has hence been another problem in that it is impossible to effect smoothly the production of a large variety of semiconductor devices in small lots.

SUMMARY OF THE INVENTION

Accordingly, an object of the present invention is to provide an apparatus for producing semiconductor devices for unmanned operations in the production of semiconductor devices and of effecting smoothly the production of a large variety of semiconductor devices in small lots, thereby overcoming the abovedescribed drawbacks of the conventional art.

To this end, an apparatus for producing semiconductor devices in accordance with the present invention comprises: splitting means for splitting a semiconductor wafer into individual dice; lead frame storage means for storing a plurality of kinds of lead frames; assembly means for assembling a die and a lead frame into a semiconductor device; die/lead frame transport means for transporting the dice split by the splitting means and lead frames stored in the lead frame storage means to the assembly means; and control means for controlling the die/lead frame transport means to transport the lead frames of the type and quantity corresponding to the dice split by the splitting means, from the lead frame storage means to the assembly means.

The above and other objects, features and advantages of the present invention will become more apparent from the following description when read in conjunction with the accompanying drawings.

BRIEF DESCRIPTION OF THE DRAWINGS

FIG. 2 is a flowchart illustrating the operation of a computer in accordance with the embodiment of FIG. 1; and FIG. 3 is a flowchart illustrating the operation of an automatic warehouse for lead frames in accordance with the embodiment of FIG. 1.

DESCRIPTION OF THE PREFERRED EMBODIMENT

Figure 1:
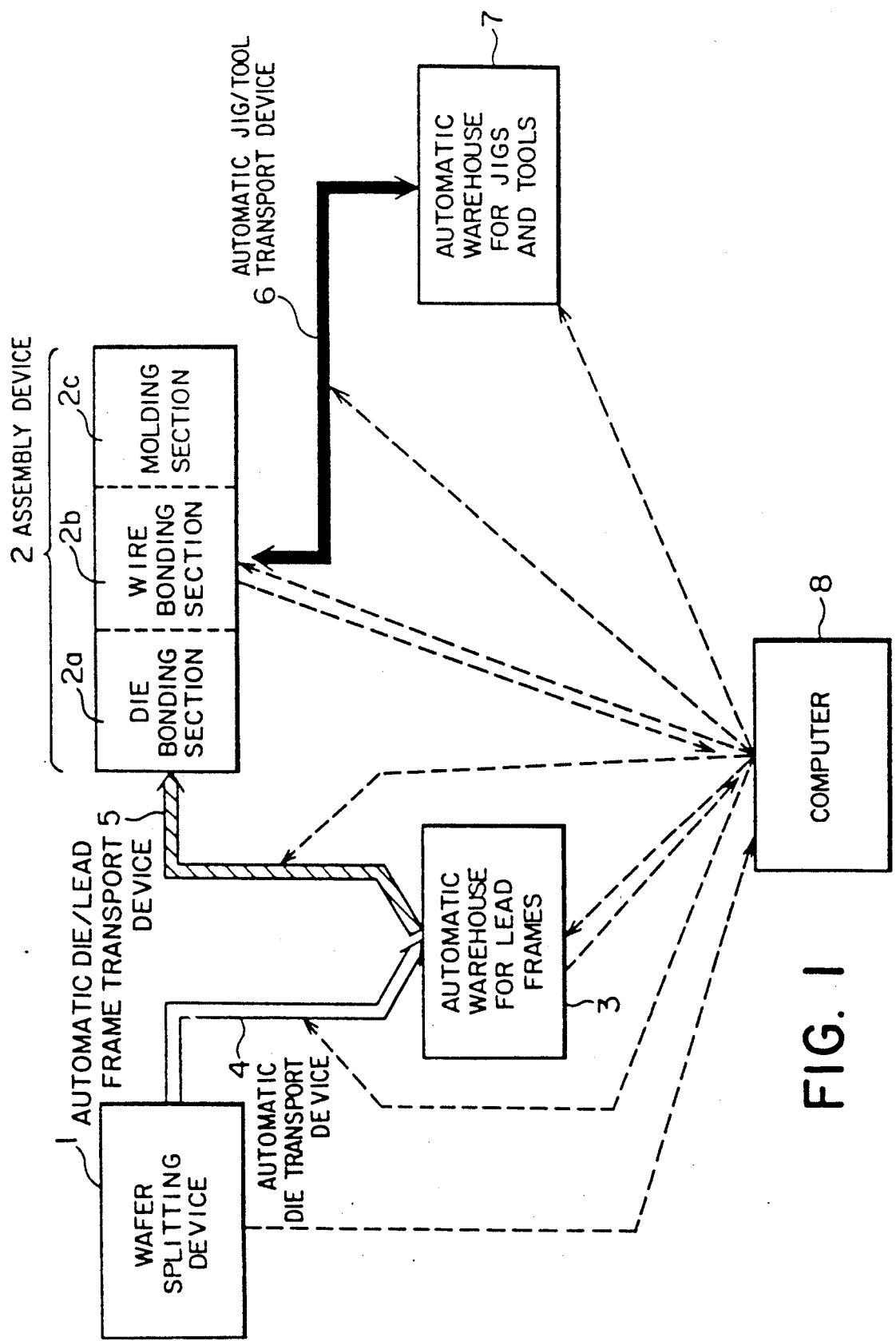
FIG. 1 is a block diagram illustrating an apparatus for producing semiconductor devices in accordance with an embodiment of the present invention.

Referring now to the accompanying drawings, a description will be made of an embodiment of the present invention.

In FIG. 1, an automatic warehouse 3 for lead frames is disposed between a wafer splitting device 1 and an assembly device 2. The wafer splitting device 1 and the automatic warehouse 3 for lead frames are connected to each other via an automatic die transport device 4, while the automatic warehouse 3 for lead frames and the assembly device 2 are connected to each other via an automatic die/lead frame transport device 5. In addition, an automatic warehouse 7 for jigs and tools is connected to the assembly device 2 via an automatic jig/tool transport device 6. A computer 8, which constitutes a control means, is connected to the aforementioned devices and warehouses 1 to 7, respectively.

The wafer splitting device 1 splits a semiconductor wafer into individual dice. The wafer is adhered to a thin sheet formed of a resin or the like, and after the wafer is split into a plurality of dice, the sheet is stretched in four directions and plastically deformed, thereby separating the adjacent dice from each other. A wafer magazine (not shown) is provided in the wafer splitting device 1, and the wafers separated into individual dice are placed into this magazine and are transported from the wafer splitting device 1.

The assembly device 2 includes a die bonding section 2a for connecting a die to a lead frame, a wire bonding section 2b for wire bonding the leads of the lead frame to the electrodes of the die, and a molding section 2c for molding a part of the lead frame and the die with resin. When a die and a lead frame are supplied to the die bonding section 2a, the die and the lead frame are automatically supplied from the die bonding section 2a to the wire bonding section 2b and further to the molding section 2c, and a resin-molded semiconductor device is thus assembled.

The automatic warehouse 3 for lead frames is connected to a material warehouse (not shown), and stores appropriate numbers of lead frames of a plurality of types received from this material warehouse. In addition, the automatic warehouse 3 for lead frames is provided with a frame magazine (not shown) for each type of lead frame, and lead frames are placed in this frame magazine and transported from the automatic warehouse 3 for lead frames.

The automatic warehouse 7 for jigs and tools stores jigs and tools that are used in the die bonding section 2a, wire bonding section 2b and molding section 2c of the assembly device 2, respectively. These jigs and tools differ for each type of die and lead frame, and are stored in sections for each type of die and lead frame.

The automatic die transport device 4 and the automatic die/lead frame transport device 5 constitute a lead frame transport means. The automatic die transport device 4, the automatic die/lead frame transport device 5, and the automatic jig/tool transport device 6 comprise automatic cars.

Referring now to the flowchart shown in FIG. 2, a description will be given of the operation of this embodiment.

First, a semiconductor wafer is split by the wafer splitting device 1. This semiconductor wafer has been previously subjected to a wafer test by a testing device (not shown), and the number of non-defective dice, which is determined on the basis of the result of the wafer test, is input from the wafer splitting device 1 to the computer 8 (Step 20). The computer 8 calculates a required number of dice by comparing the number of non-defective dice input from the wafer splitting device 1 with a predetermined number of functional integrated circuits for a production plan (Step 21). In the wafer splitting device 1, wafers split into dice are inserted into the wafer magazine (not shown).

After calculating the required quantity of dice, the computer 8 commands the automatic die transport device 4 to transfer the wafers in the wafer magazine from the wafer splitting device 1 to the automatic warehouse 3 for lead frames (Step 22). Meanwhile, the computer 8 determines the type of lead frame or part number and the required quantity of the lead frames corresponding to the dice split by the wafer splitting device 1, and supplies that data to the automatic warehouse 3 for lead frames (Step 23).

The automatic warehouse 3 for lead frames, which has received the data on the type and quantity of the required lead frame from the computer 8, performs the operation shown in FIG. 3. In other words, the automatic warehouse 3 for lead frames stocks various types of lead frames in advance from the material warehouse (not shown), the lead frames being of such a quantity as to achieve continuous production of semiconductor devices for two to three days (Step 31). Upon receiving data on the type and quantity of required lead frames from the computer 8, the automatic warehouse 3 for lead frames sets the required quantity of the required lead frames in the frame magazine (not shown) (Step 32). Subsequently, the automatic warehouse 3 for lead frames informs the computer 8 of the identification number of the frame magazine in which the required lead frames have been set as well as the number of such magazines (Step 33).

In FIG. 2, upon receiving the identification number and the number of frame magazines from the automatic warehouse 3 for lead frames (Step 24), the computer 8 commands the automatic die/lead frame transport device 5 to transport the dice and lead frames from the automatic warehouse 3 for lead frames to the assembly device 2 (Step 25). At this time, the wafers in the wafer magazine have already been transported from the wafer splitting device 1 to the automatic warehouse 3 for lead frames by means of the automatic die transport device 4. The wafers split into individual dice are inserted into the wafer magazine, while the lead frames are inserted into a frame magazine, and both of these assemblies are simultaneously transported to the assembly device 2.

In parallel with the operation of supplying data on the required lead frames to the automatic warehouse 3 for lead frames, the computer 8 supplies to the automatic warehouse 7 for jigs and tools data on jigs and tools corresponding to the dice obtained in the wafer splitting device 1 and the lead frames on which data has been supplied to the automatic warehouse 3 for lead frames (Step 26). Furthermore, the computer 8 commands the automatic jig/tool transport device 6 to transport jigs and tools from the automatic warehouse 7 for jigs and tools to the assembly device 2 (Step 27). As a result, necessary jigs and tools are transported to the assembly device 2 by the automatic jig/tool transport device 6 and are set therein.

When the dice and the lead frames are thus transported, and the jigs and tools are set, the computer 8 commands the assembly device 2 to assemble the semiconductor devices (Step 28). The assembly device 2 then automatically performs the die bonding, wire bonding and resin-molding of the semiconductor devices one after another. When a signal representing the completion of production is sent from the assembly device 2 to the computer 8, the computer 8 commands a transport device (not shown) to transport the finished products from the assembly device 2 (Step 30).

Subsequently, upon receipt of an instruction from the computer 8, the wafer magazine is returned to the wafer splitting device 1, the frame magazine is returned to the automatic warehouse 3 for lead frames, the jigs and tools used in the assembly device 2 are returned to the automatic warehouse 7 for jigs and tools to prepare for the production of ensuing semiconductor devices.

Since semiconductor devices are thus produced, it is possible to overcome the conventional drawbacks that a long time is required in the preparation of lead frames, jigs and tools and errors are committed during a change in setup. Accordingly, it is possible to produce smoothly a large variety of semiconductor devices in small lots and effect unmanned operations in the production of semiconductor devices.

It should be noted that although, in Step 20 in FIG. 2, the data on the number of non-defective dice is sent from the wafer splitting device 1 to the computer 8, the data on the number of non-defective dice may be input directly to the computer 8 from the testing device which performs the wafer test. In this case, the computer 8 calculates the necessary number of wafers from the non-defective dice and supplies data thereon to the wafer splitting device 1 to split a necessary number of wafers.

In addition, although, in Step 23 in FIG. 2, the computer 8 determines the type and quantity of lead frames corresponding to the dice split in the wafer splitting device 1 and supplies data thereon to the automatic warehouse 3 for lead frames, the computer 8 may supply the data on the type and required quantity of dice to the automatic warehouse 3 for lead frames, and the automatic warehouse 3 for lead frames may determine a corresponding type and quantity of lead frames from the type and required quantity of dice.

What is claimed is:

1. An apparatus for producing a determined number of a selected one of a plurality of different semiconductor devices according to a predetermined production plan comprising:

splitting means for splitting semiconductor wafers into a plurality of dice including a plurality of non-defective and defective dice which pass and fail a wafer test, respectively, and for generating an output indicative of the number of non-defective dice in a wafer;

lead frame storage means for storing quantities of different lead frames used in a plurality of corresponding different semiconductor devices including lead frames corresponding to a selected one of the different semiconductor devices;

transport means for transporting the dice and the lead frames corresponding to the selected semiconductor devices to an assembly means;

assembly means for assembling the dice and the lead frames transported by said transport means into the selected semiconductor devices; and control means receiving the output indicative of the number of non-defective dice in a wafer, comparing the number of non-defective dice in a wafer with a predetermined number of the selected semiconductor devices, and controlling said splitting means to split a number of wafers to provide enough non-defective dice to meet at least the predetermined number of the selected semiconductor devices and for controlling said transport means to transport to said assembly means the dice split in said splitting means and a number of the lead frames corresponding to the number of the dice produced by said splitting means.

2. An apparatus according to claim 9, wherein said assembly means comprises a die bonding section for bonding a die to a lead frame, a wire bonding section for wire bonding a lead frame to the die bonded to the lead frame, and a molding section for molding a part of the lead frame and the die bonded to the lead frame with resin.

3. An apparatus according to claim 1, wherein said transport means comprises an automatic car.

4. An apparatus according to claim 1, wherein said control means comprises a computer.

5. An apparatus according to claim 1, comprising jig/tool storage means for storing a plurality of kinds of jigs and tools used in said assembly means and jig/tool transport means for transporting the jigs and tools stored in said jig/tool storing means to said assembly means.

6. An apparatus according to claim 3, wherein said jig/tool transport means comprises an automatic car.

7. An apparatus according to claim 5 wherein said control means includes means for controlling said jig/tool transport means to transport jigs and tools corresponding to the selected semiconductor device from said jig/tool storage means to said assembly means.

8. An apparatus for producing a predetermined number of a selected one of a plurality of different semiconductor devices according to a predetermined production plan comprising:

splitting means for splitting semiconductor wafers into a plurality of dice including a plurality of non-defective and defective dice which pass and fail a wafer test, respectively;

wafer test means for identifying the number of non-defective and defective dice in a wafer split by said splitting means and for generating an output indicative of the number of non-defective dice in a wafer;

lead frame storage means for storing quantities of different lead frames used in a plurality of corresponding different semiconductor devices including lead frames corresponding to a selected one of the different semiconductor devices;

transport means for transporting the dice and the lead frames corresponding to the selected semiconductor devices to an assembly means;

assembly means for assembling the dice and the lead frames transported by said transport means into the selected semiconductor devices; and control means receiving the output indicative of the number of non-defective dice in a wafer, comparing the number of non-defective dice in a wafer with a predetermined number of the selected semiconductor devices, and controlling said splitting means to split a number of wafers to provide enough non-defective dice to meet at least the predetermined number of the selected semiconductor devices and for controlling said transport means to transport to said assembly means the dice split in said splitting means and a number of the lead frames corresponding to the number of the dice produced by said splitting means.

* * * * *

UNITED STATES PATENT AND TRADEMARK OFFICE
CERTIFICATE OF CORRECTION

PATENT NO. : 5,042,123

DATED : August 27, 1991

INVENTOR(S) : Ryuichiro Mori

It is certified that error appears in the above-identified patent and that said Letters Patent is hereby corrected as shown below:

Title Page:
Item No. [57], Abstract, line 14, change "devices" to --device--.

Column 5, line 1, change "determined" to --predetermined--.

Signed and Sealed this

Second Day of March, 1993

Attest:

STEPHEN G. KUNIN

*Attesting Officer*  *Acting Commissioner of Patents and Trademarks*